US009519315B2

(12) United States Patent
Connolly

(10) Patent No.: US 9,519,315 B2
(45) Date of Patent: *Dec. 13, 2016

(54) 276-PIN BUFFERED MEMORY CARD WITH ENHANCED MEMORY SYSTEM INTERCONNECT

(71) Applicant: International Business Machines Corporation, Armonk, NY (US)

(72) Inventor: Brian J. Connolly, Williston, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 546 days.

This patent is subject to a terminal disclaimer.

(21) Appl. No.: 13/795,132

(22) Filed: Mar. 12, 2013

(65) Prior Publication Data

US 2014/0268973 A1  Sep. 18, 2014

(51) Int. Cl.
*G11C 5/06* (2006.01)
*G06F 1/18* (2006.01)
(Continued)

(52) U.S. Cl.
CPC . *G06F 1/18* (2013.01); *G11C 5/04* (2013.01); *G11C 29/1201* (2013.01); *G11C 7/04* (2013.01); *G11C 2029/5004* (2013.01)

(58) Field of Classification Search
None
See application file for complete search history.

(56) References Cited

U.S. PATENT DOCUMENTS 5,377,199 A * 12/1994 Fandrich .......... G01R 31/31908
714/726
5,428,624 A * 6/1995 Blair .................... G06F 11/261
324/762.02
(Continued)

FOREIGN PATENT DOCUMENTS

DE  102004043063  3/2006
JP  2007164599  6/2007
(Continued)

OTHER PUBLICATIONS

R.X. Arroyo, et al., "IBM Power7 Systems," IBM Journal of Research and Developement, vol. 55, Issue 3, May-Jun. 2011, pp. 2: 1-2:13.
(Continued)

Primary Examiner — Yaima Rigol
Assistant Examiner — Edward Waddy, Jr.
(74) Attorney, Agent, or Firm — Cantor Colburn LLP

(57) ABSTRACT

An embodiment is a memory card including a rectangular printed circuit card having a first side and a second side, a first length of between 151.35 and 161.5 millimeters, and first and second ends having a second length smaller than the first length. The memory card also includes a first plurality of pins on the first side extending along a first edge of the rectangular printed circuit card that extends along a length of the card, a second plurality of pins on the second side extending on the first edge of the rectangular printed circuit card, and a positioning key having its center positioned on the first edge of the rectangular printed circuit card and located between 94.0 and 95.5 millimeters from the first end of the rectangular printed circuit card. The memory card also includes a memory module, a hub device and pins for boundary scan signals.

20 Claims, 11 Drawing Sheets

(51) Int. Cl.
*G11C 5/04* (2006.01)
*G11C 29/12* (2006.01)
*G11C 7/04* (2006.01)
*G11C 29/50* (2006.01)

(56) References Cited

U.S. PATENT DOCUMENTS

| | | |
|---|---|---|
| 5,513,135 A | 4/1996 | Dell et al. |
| 5,629,889 A | 5/1997 | Chandra et al. |
| 5,640,515 A | 6/1997 | Park |
| 5,692,913 A | 12/1997 | Takano et al. |
| 5,745,672 A | 4/1998 | Stiffler |
| 6,163,867 A | 12/2000 | Miller et al. |
| 6,302,700 B1 | 10/2001 | Puri et al. |
| 6,315,614 B1 | 11/2001 | Hassanzadeh et al. |
| 6,316,988 B1 | 11/2001 | Forehand et al. |
| 6,381,685 B2 | 4/2002 | Dell et al. |
| 6,424,555 B1 | 7/2002 | Chang |
| 6,430,719 B1 | 8/2002 | Slezak et al. |
| 6,477,614 B1 | 11/2002 | Leddige et al. |
| 6,633,994 B1 | 10/2003 | Hofmann et al. |
| 6,665,736 B1 | 12/2003 | Fan |
| 6,681,378 B2 | 1/2004 | Wang et al. |
| 6,704,895 B1 | 3/2004 | Swoboda et al. |
| 6,708,049 B1 * | 3/2004 | Berson et al. ............. 600/323 |
| 6,920,519 B1 | 7/2005 | Beukema et al. |
| 7,051,131 B1 | 5/2006 | Wiedenman et al. |
| 7,078,793 B2 | 7/2006 | Ruckerbauer et al. |
| 7,103,746 B1 | 9/2006 | Kulick |
| 7,120,727 B2 | 10/2006 | Lee et al. |
| 7,133,991 B2 | 11/2006 | James |
| 7,185,126 B2 | 2/2007 | Szabelski |
| 7,194,593 B2 | 3/2007 | Schnepper |
| 7,206,887 B2 | 4/2007 | Jeddeloh |
| 7,222,210 B2 | 5/2007 | Jeddeloh |
| 7,222,213 B2 | 5/2007 | James |
| 7,224,595 B2 | 5/2007 | Dreps et al. |
| 7,234,099 B2 | 6/2007 | Gower et al. |
| 7,257,683 B2 | 8/2007 | Jeddeloh et al. |
| 7,343,533 B2 | 3/2008 | Lee et al. |
| 7,356,652 B1 | 4/2008 | Dew et al. |
| 7,363,419 B2 | 4/2008 | Cronin et al. |
| 7,529,112 B2 * | 5/2009 | Dreps et al. .................. 365/51 |
| 7,545,651 B2 | 6/2009 | Goodwin et al. |
| 7,656,744 B2 | 2/2010 | Aoki et al. |
| 7,717,752 B2 | 5/2010 | Loughner et al. |
| 7,859,298 B1 | 12/2010 | Swartz |
| 7,870,459 B2 | 1/2011 | Hazelzet |
| 7,930,604 B1 | 4/2011 | Azimi et al. |
| 7,949,919 B2 | 5/2011 | Wu et al. |
| 7,969,736 B1 | 6/2011 | Iyengar et al. |
| 8,205,107 B2 | 6/2012 | Berke |
| 2002/0038405 A1 | 3/2002 | Leddige et al. |
| 2002/0170000 A1 * | 11/2002 | Gorodetsky ........... G01R 1/025 714/30 |
| 2004/0059971 A1 * | 3/2004 | Cowan ............... G01R 31/2834 714/724 |
| 2004/0113654 A1 | 6/2004 | Lundberg |
| 2005/0144403 A1 * | 6/2005 | Jeddeloh ................... 711/154 |
| 2006/0095620 A1 * | 5/2006 | Dreps et al. .................. 710/100 |
| 2006/0095701 A1 | 5/2006 | Gower et al. |
| 2006/0118950 A1 | 6/2006 | Amidi et al. |
| 2006/0242541 A1 | 10/2006 | Gower et al. |
| 2007/0005922 A1 | 1/2007 | Swaminathan et al. |
| 2007/0233821 A1 * | 10/2007 | Sullivan ............... G06F 11/142 709/220 |
| 2008/0072109 A1 * | 3/2008 | Swietek et al. ................ 714/718 |
| 2008/0126852 A1 * | 5/2008 | Brandyberry ....... G06F 11/0787 714/6.13 |
| 2010/0003837 A1 * | 1/2010 | Loughner ................ G11O 5/04 439/64 |
| 2010/0005218 A1 * | 1/2010 | Gower ............... G06F 13/4234 711/5 |
| 2010/0064099 A1 * | 3/2010 | Nishtala et al. ............. 711/105 |
| 2010/0157645 A1 | 6/2010 | Harashima et al. |
| 2010/0162037 A1 | 6/2010 | Maule et al. |
| 2011/0004793 A1 | 1/2011 | Sul et al. |
| 2011/0007476 A1 | 1/2011 | Joshi et al. |
| 2011/0153903 A1 * | 6/2011 | Hinkle et al. ................. 710/313 |
| 2013/0036255 A1 * | 2/2013 | Fai ....................... G06F 11/267 711/103 |
| 2013/0063124 A1 | 3/2013 | Yang |

FOREIGN PATENT DOCUMENTS

| | | |
|---|---|---|
| JP | 2008046797 | 2/2008 |
| JP | 2010152522 | 7/2010 |
| WO | WO2006083899 | 8/2006 |

OTHER PUBLICATIONS

U.S. Appl. No. 13/466,682; Non-Final Office Action, Date Filed: May 8, 2012; Date Mailed: Jun. 1, 2015; 59 pages.

U.S. Appl. No. 13/466,682; Final Office Action; Date Filed: May 8, 2012, Date Mailed: Sep. 22, 2015; 44 pages.

* cited by examiner

| | | 276 PIN CONNECTOR | | DISTANCE FROM CENTER | |
|---|---|---|---|---|---|
| TOP PIN NO. | PIN FUNCTION | BOTTOM PIN NO. | PIN FUNCTION | OF NOTCH (KEY), mm | |
| 1 | VTT_TST | 139 | VTT_TST | 89.5 | (DISTANCE TO LEFT |
| 2 | VREFDQA_TEST | 140 | VREFDQB_TEST | 88.5 | OF NOTCH, |
| 3 | VREFDQD_TEST | 141 | VREFDQC_TEST | 87.5 | FRONT VIEW) |
| 4 | VPP | 142 | VPP | 86.5 | |
| 5 | VREFCA_TST | 143 | FSI_SEL_B | 85.5 | |
| 6 | SCL_SPR | 144 | SDA_SPR | 84.5 | |
| 7 | 1.35/1.2v | 145 | 1.35/1.2v | 83.5 | |
| 8 | SCL_MSTR | 146 | SDA_MSTR | 82.5 | |
| 9 | VDDspd | 147 | VDDspd | 81.5 | |
| 10 | VPP | 148 | VPP | 80.5 | |
| 11 | 1.35/1.2v | 149 | 1.35/1.2v | 79.5 | |
| 12 | 1.35/1.2v | 150 | 1.35/1.2v | 78.5 | |
| 13 | GND | 151 | GND | 77.5 | |
| 14 | 1.35/1.2v | 152 | 1.35/1.2v | 76.5 | |
| 15 | 1.35/1.2v | 153 | 1.35/1.2v | 75.5 | |
| 16 | GND | 154 | GND | 74.5 | |
| 17 | RESET | 155 | RESETr | 73.5 | |
| 18 | VPP | 156 | VPP | 72.5 | |
| 19 | 1.35/1.2v | 157 | 1.35/1.2v | 71.5 | |
| 20 | GND | 158 | GND | 70.5 | |
| 21 | FAULT | 159 | FAULTr | 69.5 | |
| 22 | GND | 160 | GND | 68.5 | |
| 23 | VPP | 161 | VPP | 58.5 | |
| 24 | 1.35/1.2v | 162 | 1.35/1.2v | 66.5 | |
| 25 | PFSIC0 | 163 | PFSIC1 | 65.5 | |
| 26 | VDDstby | 164 | VDDstby | 64.5 | |
| 27 | PFSID0 | 165 | PFSID1 | 63.5 | |
| 28 | GND | 166 | GND | 62.5 | |
| 29 | 1.35/1.2v | 167 | 1.35/1.2v | 61.5 | |
| 30 | 1.35/1.2v | 168 | 1.35/1.2v | 60.5 | |
| 31 | TE_PLL_BYPASS_EN | 169 | TE_CARD_TEST_EN | 59.5 | |
| 32 | 1.35/1.2v | 170 | 1.35/1.2v | 58.5 | |
| 33 | GND | 171 | GND | 57.5 | |
| 34 | DMIDS0 | 172 | DMIDS1 | 56.5 | |
| 35 | DMIDS0# | 173 | DMIDS1# | 55.5 | |
| 36 | GND | 174 | GND | 54.5 | |
| 37 | DMIDS2 | 175 | DMIDS3 | 53.5 | |
| 38 | DMIDS2# | 176 | DMIDS3# | 52.5 | |
| 39 | GND | 177 | GND | 51.5 | |
| 40 | DMIDS4 | 178 | DMIDS5 | 50.5 | |
| 41 | DMIDS4# | 179 | DMIDS5# | 49.5 | |
| 42 | GND | 180 | GND | 48.5 | |
| 43 | 1.35/1.2v | 181 | 1.35/1.2v | 47.5 | |
| 44 | 1.35/1.2v | 182 | 1.35/1.2v | 46.5 | |
| 45 | GND | 183 | GND | 45.5 | |
| 46 | DMIDS6 | 184 | DMIDS7 | 44.5 | |

| | | |
|---|---|---|
| 47 DMIDS6# | 185 DMIDS7# | 43.5 |
| 48 GND | 186 GND | 42.5 |
| 49 DMIDSCK | 187 DMIDSCKr | 41.5 |
| 50 DMIDSCK# | 188 DMIDSCKr# | 40.5 |
| 51 GND | 189 GND | 39.5 |
| 52 DMIDS8 | 190 DMIDS9 | 38.5 |
| 53 DMIDS8# | 191 DMIDS9# | 37.5 |
| 54 GND | 192 GND | 36.5 |
| 55 1.35/1.2v | 193 1.35/1.2v | 35.5 |
| 56 1.35/1.2v | 194 1.35/1.2v | 34.5 |
| 57 GND | 195 GND | 33.5 |
| 58 DMIDS10 | 196 DMIDS11 | 32.5 |
| 59 DMIDS10# | 197 DMIDS11# | 31.5 |
| 60 GND | 198 GND | 30.5 |
| 61 DMIDS12 | 199 DMIDS13 | 29.5 |
| 62 DMIDS12# | 200 DMIDS13# | 28.5 |
| 63 GND | 201 GND | 27.5 |
| 64 DMIDS14 | 202 DMIDS15 | 26.5 |
| 65 DMIDS14# | 203 DMIDS15# | 25.5 |
| 66 GND | 204 GND | 24.5 |
| 67 DMIDS16 | 205 1.35/1.2v | 23.5 |
| 68 DMIDS16# | 206 1.35/1.2v | 22.5 |
| 69 GND | 207 GND | 21.5 |
| 70 DMI_REFCLK | 208 DMI_REFCLKr | 20.5 |
| 71 DMI_REFCLK# | 209 DMI_REFCLKr# | 19.5 |
| 72 GND | 210 GND | 18.5 |
| 73 DDR_REFCLK | 211 DDR_REFCLKr | 17.5 |
| 74 DDR_REFCLK# | 212 DDR_REFCLK# | 16.5 |
| 75 GND | 213 GND | 15.5 |
| 76 DMIUS0 | 214 DMIUS1 | 14.5 |
| 77 DMIUS0# | 215 DMIUS1# | 13.5 |
| 78 GND | 216 GND | 12.5 |
| 79 DMIUS2 | 217 DMIUS3 | 11.5 |
| 80 DMIUS2# | 218 DMIUS3# | 10.5 |
| 81 GND | 219 GND | 9.5 |
| 82 DMIUS4 | 220 DMIUS5 | 8.5 |
| 83 DMIUS4# | 221 DMIUS5# | 7.5 |
| 84 GND | 222 GND | 6.5 |
| 85 DMIUS6 | 223 DMIUS7 | 5.5 |
| 86 DMIUS6# | 224 DMIUS7# | 4.5 (DISTANCE TO LEFT |
| 87 GND | 225 GND | 3.5 OF NOTCH, |
| 88 1.35/1.2v | 226 1.35/1.2v | 2.5 FRONT VIEW) |
| KEY/NOTCH | | |
| 89 1.35/1.2v | 227 1.35/1.2v | 2.5 (DISTANCE TO RIGHT |
| 90 GND | 228 GND | 3.5 OF NOTCH, |
| 91 DMIUS8 | 229 DMIUS9 | 4.5 FRONT VIEW) |
| 92 DMIUS8# | 230 DMIUS9# | 5.5 |
| 93 GND | 231 GND | 6.5 |

FIG. 4B

| | | | | |
|---|---|---|---|---|
| 94 | DMIUS10 | 232 | DMIUS11 | 7.5 |
| 95 | DMIUS10# | 233 | DMIUS11# | 8.5 |
| 96 | GND | 234 | GND | 9.5 |
| 97 | DMIUSCK | 235 | DMIUSCKr | 10.5 |
| 98 | DMIUSCK# | 236 | DMIUSCKr# | 11.5 |
| 99 | GND | 237 | GND | 12.5 |
| 100 | DMIUS12 | 238 | DMIUS13 | 13.5 |
| 101 | DMIUS12# | 239 | DMIUS13# | 14.5 |
| 102 | GND | 240 | GND | 15.5 |
| 103 | DMIUS14 | 241 | DMIUS15 | 16.5 |
| 104 | DMIUS14# | 242 | DMIUS15# | 17.5 |
| 105 | GND | 243 | GND | 18.5 |
| 106 | DMIUS16 | 244 | DMIUS17 | 19.5 |
| 107 | DMIUS16# | 245 | DMIUS17# | 20.5 |
| 108 | GND | 246 | GND | 21.5 |
| 109 | DMIUS18 | 247 | DMIUS19 | 22.5 |
| 110 | DMIUS18# | 248 | DMIUS19# | 23.5 |
| 111 | GND | 249 | GND | 24.5 |
| 112 | DMIUS20 | 250 | DMIUS21 | 25.5 |
| 113 | DMIUS20# | 251 | DMIUS21# | 26.5 |
| 114 | GND | 252 | GND | 27.5 |
| 115 | DMIUS22 | 253 | DMIUS23 | 28.5 |
| 116 | DMIUS22# | 254 | DMIUS23# | 29.5 |
| 117 | GND | 255 | GND | 30.5 |
| 118 | 1.35/1.2v | 256 | 1.35/1.2v | 31.5 |
| 119 | GND | 257 | GND | 32.5 |
| 120 | 1.1v | 258 | 1.1v | 33.5 |
| 121 | 1.1v | 259 | 1.1v | 34.5 |
| 122 | GND | 260 | GND | 35.5 |
| 123 | 1.0v | 261 | 1.0v | 36.5 |
| 124 | 1.0v | 262 | 1.0v | 37.5 |
| 125 | 1.0v | 263 | 1.0v | 38.5 |
| 126 | GND | 264 | GND | 39.5 |
| 127 | 0.9v | 265 | 0.9v | 40.5 |
| 128 | 0.9v | 266 | 0.9v | 41.5 |
| 129 | 0.9v | 267 | 0.9v | 42.5 |
| 130 | 0.9v | 268 | 0.9v | 43.5 |
| 131 | 1.35/1.2v | 269 | 1.35/1.2v | 44.5 |
| 132 | 0.9v | 270 | 0.9v | 45.5 |
| 133 | 0.9v | 271 | 0.9v | 46.5 |
| 134 | 0.9v | 272 | 0.9v | 47.5 |
| 135 | 0.9v | 273 | 0.9v | 48.5 |
| 136 | 0.9v | 274 | 0.9v | 49.5 (DISTANCE TO RIGHT |
| 137 | GND | 275 | GND | 50.5 OF NOTCH, |
| 138 | 1.5v | 276 | 1.5v | 51.5 FRONT VIEW) |

FIG. 4C

276-PIN BUFFERED MEMORY CARD WITH ENHANCED MEMORY SYSTEM INTERCONNECT

BACKGROUND

The present invention relates generally to computer memory subsystems and, more particularly, to a buffered memory card having an enhanced memory system interconnect and features.

Contemporary high performance computing main memory systems are generally composed of one or more memory devices, which are connected to one or more memory controllers and/or processors via one or more memory interface elements such as buffers, hubs, bus-to-bus converters, etc. The memory devices are generally located on a memory subsystem such as a memory card or memory module and are often connected via a pluggable interconnection system (e.g. one or more connectors) to a system board (e.g. a PC motherboard).

Overall computer system performance is affected by each of the key elements of the computer structure, including the performance/structure of the processor(s), any memory cache(s), the input/output (I/O) subsystem(s), the efficiency of the memory control function(s), the performance of the main memory devices(s) and any associated memory interface elements, and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling). In addition, customers are requiring the ability to access an increasing number of higher density memory devices (e.g. DDR4 and DDR3 SDRAMs) at faster and faster access speeds.

SUMMARY

An embodiment is a memory card including a rectangular printed circuit card having a first side and a second side, a first length of between 151.35 and 161.5 millimeters, and first and second ends having a second length smaller than the first length. The memory card also includes a first plurality of pins on the first side extending along a first edge of the rectangular printed circuit card that extends along a length of the rectangular printed circuit card, a second plurality of pins on the second side extending on the first edge of the rectangular printed circuit card, and a positioning key having its center positioned on the first edge of the rectangular printed circuit card and located between 94.0 and 95.5 millimeters from the first end of the rectangular printed circuit card, the first plurality of pins and the second plurality of pins including pins for boundary scan testing of components located on the rectangular printed circuit card.

Another embodiment is a memory card including a card having a length of between 151.5 and 161.35 millimeters, the card having a first side including a first end, a second end, and a first edge that extends the length of the card between the first end and the second end. The memory card also includes a positioning key having its center positioned on the first edge and located 89.5 millimeters from a first pin proximate the first end of the card and positioned 51.5 millimeters from a last pin proximate the second end of the card when viewed from the first side and a plurality of primary upstream bus interface pins arranged on the card for communicating with a high-speed upstream bus, such that the primary upstream bus interface pins associated with the high-speed upstream bus are located between than 14.5 millimeters to the left and 29.5 millimeters to the right of the positioning key and the first end when viewed from the first side. The memory card includes a plurality of pins for boundary scan testing an interconnect of a memory module and a hub device on the card, the plurality of pins being located between 86.5 millimeters and 58.5 millimeters to the left of the positioning key when viewed from the first side.

BRIEF DESCRIPTION OF THE SEVERAL VIEWS OF THE DRAWINGS

FIG. 4 is made up of FIGS. 4a, 4b and 4c, and depicts a table illustrating a functional pin assignment for a 276-pin DIMM that may be implemented by an exemplary embodiment;

DETAILED DESCRIPTION

Figure 1:
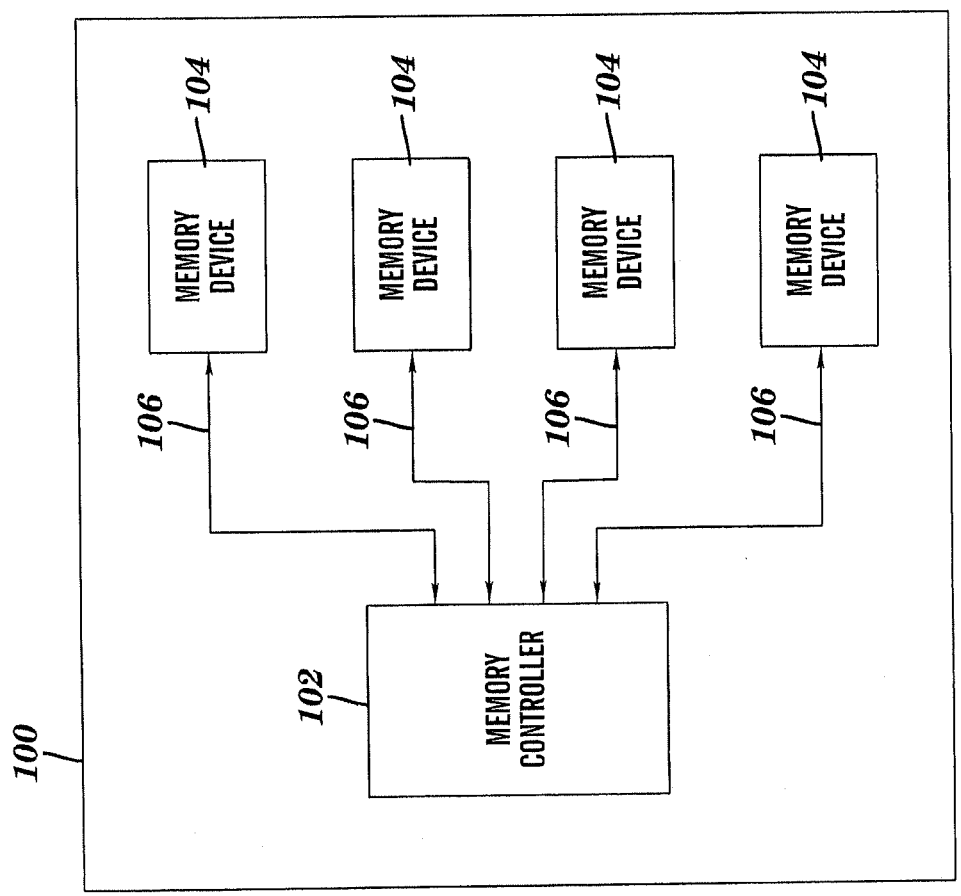
FIG. 1 is a block diagram of a memory system in accordance with an embodiment.

An exemplary embodiment provides for an improvement in memory system/subsystem reliability and fault tolerance. As computer systems evolve, the need for enhanced performance as well as improved reliability/fault tolerance becomes more important. The memory channels (interface) between a memory controller and one or more memory subsystems (e.g. memory module(s)), are required to operate at increasing data rates. The wide range of memory requirements such as increased memory capacity, reduced latency, and power management create the need for a very flexible set of memory configurations.

An exemplary embodiment implements a high speed interconnect communication interfaces (e.g. one interconnect memory channels) between a memory controller and one memory hub device(s) using two unidirectional links each with full differential signaling. The downstream link from the memory controller to the hub device includes eighteen differential pairs made up of fourteen active logical signals, two spare lanes, one calibration and a bus clock. The upstream link from the hub device to the memory controller includes twenty-five differential pairs made up of twenty-one active logical signals, two spare lanes, one calibration and a bus clock. The hub device has the capability to support four full memory ports (e.g. having distinct and separate address, command, control and data connections), with each memory port communicating with one to eight ranks of memory devices and each rank including eight bytes of data as well as eight bits of error code correction (ECC). In an exemplary embodiment, these memory ports can be operated simultaneously and independently of each other.

In an exemplary memory card embodiment, numerous memory module configurations are supported, as dictated by various system requirements. Example memory module configurations include, but are not limited to: a buffered memory module designed for use in a point-to-point interconnect structure either directly with a memory controller; a buffered memory module having a single hub devices, configured to permit communication with a memory controller via two memory channels (thereby appearing as two parallel memory modules and/or otherwise increasing the effective data bus width to the memory controller);

In addition, for exemplary memory modules that support higher memory rank counts (e.g., four or eight ranks), discrete registering drivers (e.g. discrete registers and/or register/clock devices) may be included between the hub device and the memory devices to re-drive one or more of the command, address, and control signals, with some devices also and/or independently operable to buffer and/or re-sync (e.g. via a PLL or DLL) the memory interface clock(s). To support improved test capability, additional memory interface signals may be provided on the memory subsystem connector (e.g. on a DIMM and the DIMM connector) to provide the reference voltage levels supplied to the memory devices (VREFCA_TST, VREFDQ_TST, and VTT_TST).

With increased memory performance and memory capacity comes the additional adverse effect of increased overall memory subsystem power. One mechanism to partially offset the additional power is to use wider I/O memory devices on the memory subsystem (e.g. DIMM), such as x8 devices rather than x4 devices. The use of wider memory devices generally results in a negative impact in regard to overall memory subsystem reliability, often due in part to the limited coverage of the error detection and correction codes often utilized in such memory systems (e.g. 72/80 codes). As a result of the increased data I/O width, in conjunction with the total data bits available to the memory controller (generally 72 bits for a 8 byte memory subsystem), when an uncorrectable error or "chip kill" event occurs on the wide I/O memory device (e.g. a "x8" device), the ability of the memory subsystem to correctly identify, correct and/or otherwise recover from the event is reduced.

FIG. 1 depicts a block diagram of a memory system 100 in accordance with an embodiment. A memory controller 102 is in communication with a plurality of associated memory devices 104 via a plurality of memory buses 106. In one embodiment, the memory buses 106 are bi-directional. In another embodiment each memory bus 106 includes two uni-directional busses. In an embodiment, the memory buses 106 transmit clock, data, commands, and a data strobe between the memory controller 102 and the memory devices 104.

Figure 2:
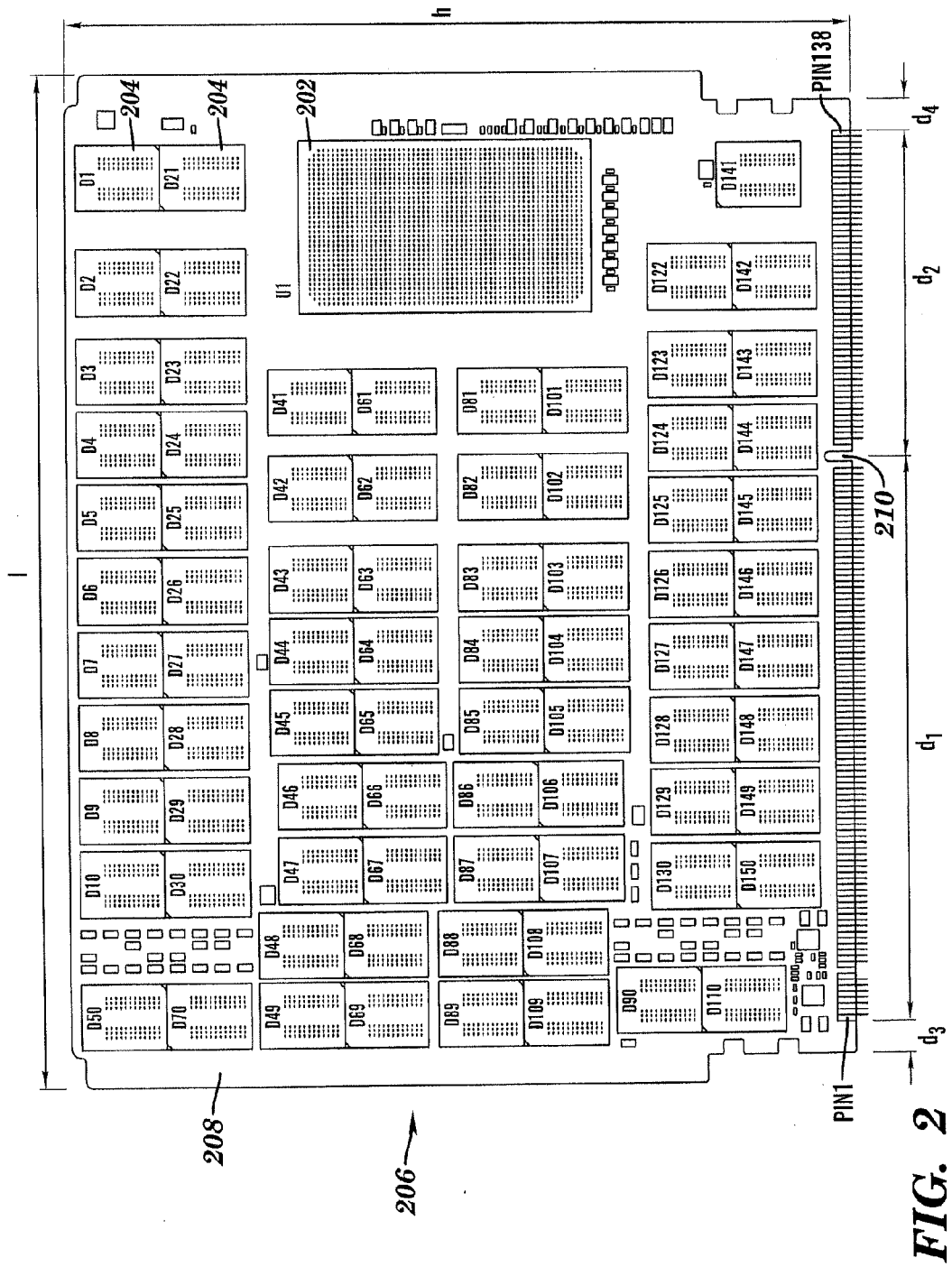
FIG. 2 depicts a front view of a buffered memory card that may be implemented by an exemplary embodiment.

FIG. 2 depicts a front view of a buffered memory card or module 206 (e.g. a dual in-line memory module or "DIMM") that may be implemented by an exemplary embodiment. In an exemplary embodiment such as that shown in FIG. 2, each memory module 206 includes a raw card (e.g. a printed circuit board) having dimensions of nominally 161.35 millimeters long and 113.2 millimeters tall, a plurality of DRAM positions, a hub device 202 and numerous small components as known in the art that are not shown and/or identified but are included in exemplary embodiments, such as capacitors, resistors and EEPROM(s). In an embodiment, the card length ranges from 151.35 to 161.5 millimeters. In another embodiment, the card length ranges from 151.5 to 161.35 millimeters. It is understood that the stated dimensions are nominal and that they may vary (e.g., plus or minus three millimeters) in various implementations (e.g. pinned or pluggable modules optimized for varying memory systems). In an exemplary embodiment, the hub device 202 is offset and located in the center region of the front side of the memory module 206, as depicted in FIG. 2. In other embodiments, the hub device 202 may be located in the center of the module. The memory devices 204 are located to one side and above and below the hub device 202, as well as on the backside of the memory module 206, which is not shown. In the exemplary embodiment, the configuration is utilized to facilitate high speed wiring between the hub device 202 and memory devices 204 as well to facilitate high speed wiring from the hub device 202 to the module pins.

In further exemplary embodiments, sixteen, eighteen, thirty two, thirty six, seventy two or other memory device positions may be included on the memory module 206, and the card height may be increased (e.g., to 118 millimeters or other dimensions) or decreased (e.g., to 71.2 millimeters or other dimensions) to commensurate with such factors as the dimensional requirements of the memory devices 204, the dimensional requirements of the hub device 202, the system dimensional requirements, the space required for the interconnect wiring on the module as well as the area required for support devices (e.g. capacitors, EEPROM(s) and/or resistors).

As is also shown in FIG. 2, the location of a positioning key 210 (e.g. a "notch") is specifically shifted from the midpoint of the length, l, of the card 208 (with respect to prior generation modules) in order to ensure that the module cannot be fully inserted into a connector intended for a different module type. In addition, the positioning key 210 location also prevents reverse insertion of the DIMM and provides a visual aid to the end-user regarding proper DIMM insertion. In an embodiment, the first pin is proximate a first end of the card while the last pin (PIN 138) is proximate a second end of the card. In the exemplary embodiment shown in FIG. 2, the positioning key 210 is located between pins 88/226 and 89/227 (front pin number/back pin number, read from left to right when facing the DIMM with the pins facing downward, as shown in the figure). As such, the distance $d_1$ along the length, l, of the card 208 is larger than the distance $d_2$. In an embodiment, $d_1$ is 89.5 millimeters while $d_2$ is 51.5 millimeters. Further, distance $d_3$ represents the dimension between the edge and PIN 1 while distance $d_4$ represents the dimension between the opposite edge and PIN 138. In an embodiment, the positioning key 210 is about 5 millimeters wide. In an exemplary embodiment, such as the one depicted in FIG. 2, the center of the positioning key is located a nominal distance of 94.0-to 95.5 millimeters ($d_1$ plus $d_3$) from one end of the card (the end on the left in FIG. 2) and a nominal distance of 56.0 to 57.5 millimeters ($d_2$ plus $d_4$) from the other end of the card (the end on the right in FIG. 2). It is understood that the stated dimensions are nominal and that they may vary (e.g., plus or minus three millimeters) in various implementations.

In an exemplary embodiment, the card 208 depicted in FIG. 2 includes a first plurality of pins located on the first side (the front side depicted in FIG. 2) and a second plurality of pins located on the second side (the back side not depicted in FIG. 2).

In another exemplary embodiment, the DIMM is a "winged" DIMM. For exemplary "winged" DIMMs, some distance above the edge containing the pins (with the distance typically selected such that the DIMM extensions ("wings") are above the connector latching mechanisms) the DIMM raw card includes an extension to the left and/or right of the normal exemplary DIMM length. The extension(s) permit one or more of the use of mechanical stiffeners and/or brackets (e.g. placed on the system board, memory cover, etc) providing additional means to further stabilize the DIMM beyond that provided by the connector, allow the placement of additional components (e.g. active and/or passive circuitry), etc. while permitting the existing connector to be utilized. For tall DIMMs, such as exemplary DIMMs being 100 to 120 mm in height, the use of mechanical stiffeners permitted by the raw card extensions ("wings") results in less connector contact wear due to vibration and will reduce the probability of intermittent signal transmission across the connector/DIMM interface. In an exemplary embodiment, the DIMM raw card extends both 5 millimeters to the right and to the left of as compared to DIMM raw cards having no extensions. In another exemplary embodiment, the DIMM raw card extends more or less distance from the edge(s) of the DIMM being retained by the connector, based on the additional retention means and/or additional components placed in the additional raw card area provided by the extensions to the right and/or to the left.

Figure 3:
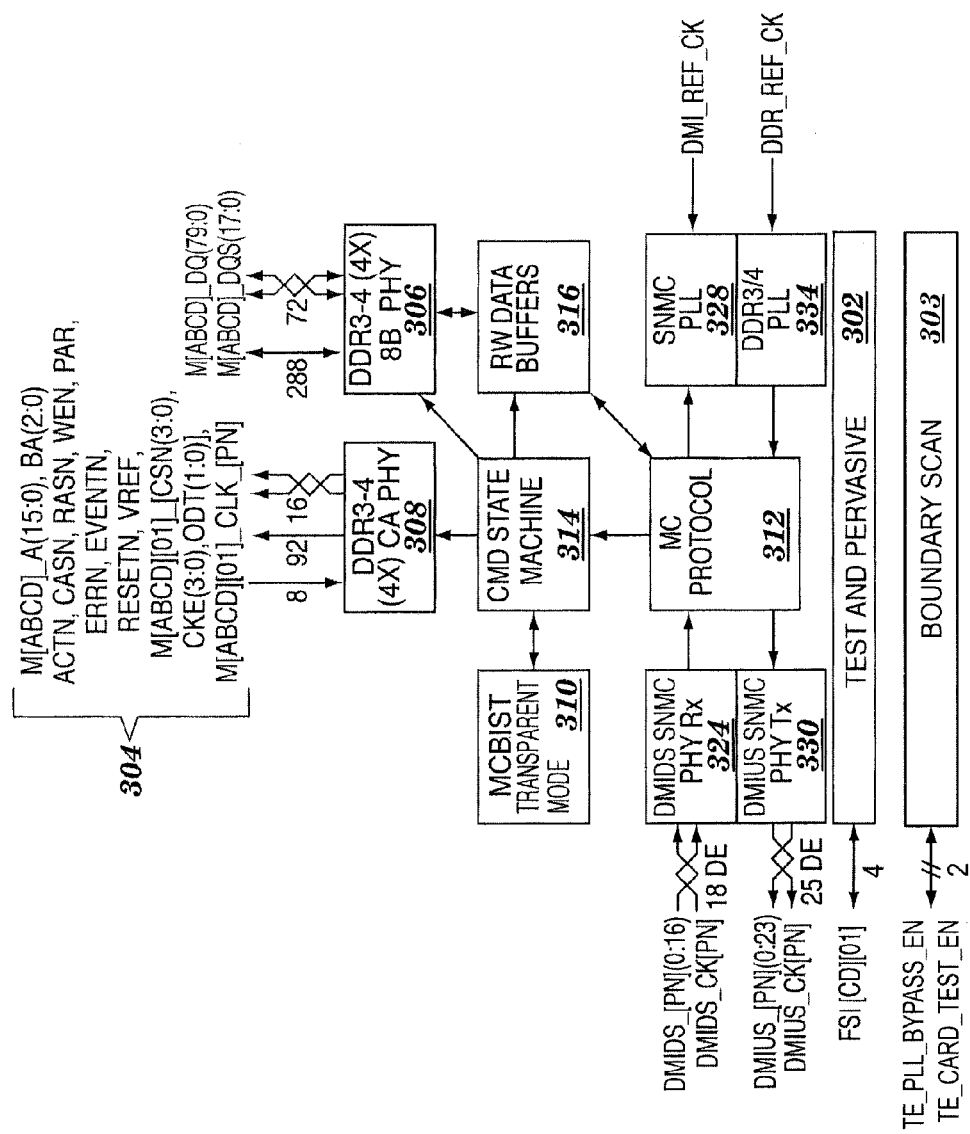
FIG. 3 is a block diagram of the high-level logic flow of a hub device that may be implemented by an exemplary embodiment.

FIG. 3 is a block diagram of the high-level logic flow of a hub device that may be implemented by an exemplary embodiment. The blocks in the lower left and right portions of the drawing (324, 330, 328, 334) are associated with receiving or driving a high-speed bus including the high speed unidirectional upstream and downstream buses previously referenced. "Upstream" refers to the one or more bus(es) passing information to and/or from the hub device in the direction of the memory controller, and "downstream" refers to the bus(es) passing information from the hub device to and/or from the modules and/or buffers located further away from the memory controller.

Referring to FIG. 3, data, command, address, error detection information (e.g. ECC bits and/or CRC bits), and clock signals from an upstream memory module or memory controller are received (in the exemplary embodiment, in the form of data packets), from the high speed interconnect downstream (e.g. the "primary downstream" (DMIDS)) memory bus into a receiver functional block 324. The receiver functional block 324 includes receiver and re-sync circuitry and other support logic to enable the capturing of information from an upstream device, as well as bitlane sparing and calibration circuitry to enable the replacement of one or more defective data and/or clock differential pairs between the receiving device and the sending device (e.g. one or more segments comprising a part of the interconnect channel). In the exemplary embodiment, said sparing circuitry exists in each of the driver and receiver functional blocks (324, 330, 328, 334), as well as in the memory controller, and permits any one or more of the differential pairs between any two devices on the memory bus to be replaced by an unused an/or underutilized ("spare") differential signal pair—retaining full function and failure coverage on the affected bus—thereby resulting in improved product long-term memory system reliability and usability given the ability to continue normal operation of the memory system independent of one or more faults resident in one or more segments of the one or more memory system bus(es) which further operate together to comprise the memory controller channel(s).

An exemplary embodiment of the downstream memory bus further enables operation of a eighteen differential pairs, high-speed fully differential, slave receiver bus further including one or more (e.g.) differential) spare bitlane(s) and calibration lane(s). In an exemplary embodiment, the receiver functional block 324 transmits the received signals to a memory controller (MC) protocol functional block 312 which passes the received signals to a command state machine functional block 314 (e.g. address, command and control information) and read/write data buffers 316 (e.g. data to be written to the memory device(s), generally also including memory date ECC "check" bits). In an exemplary embodiment, MC protocol functional block 312 further includes circuitry to validate the received data prior to and/or after re-driving the received data, e.g. using ECC and/or CRC bits included in the memory packet, enabling the hub to identify and report faults present in the received data since being sent by the transmitting device.

In an exemplary embodiment, the command state machine functional block 314 determines if the signals (which will generally include one or more of data, command, control and address signals) are directed to and should be processed by the current memory module where the hub device is located. If the signals are directed to the current memory module, then the command state machine functional block 314 determines what actions to take (e.g. by decoding the one or more commands which may be included in the packet) and may initiate memory device actions, write buffer actions, read buffer actions, internal hub actions (e.g. MCBIST) or a combination thereof. In the exemplary embodiment, depending on the type of memory module, the command state machine functional block 314 selects the appropriate drive characteristics, timings and timing relationships based on register settings established during initialization and/or periodic operational evaluation of the memory device interface. In an exemplary embodiment, the MC protocol functional block 312 provides the conversion between signals received via the high speed bus in a packetized memory interface format into a memory module data rate, currently a non-packetized memory module interface format although the memory devices may operate using a device-specific packetized interface in future embodiments, necessitating conversion to that interface. The read/write data buffers 316 transmit the data (e.g. the information to be written to the memory device(s) to a memory data interface block 306 and the command state machine functional block 314 transmits the associated addresses, control and command signals to a memory command interface block 308, with the signals consistent with the memory device specification in the exemplary embodiment. The memory command interface functional block 308 transmits the associated addresses, control and command signals 304 to a memory device via an address/command bus (which includes one or more of address, control, command information and error information, as indicated in the exemplary list comprising 304). The memory data interface functional block 306 reads from and writes memory data 342 to a memory device via a data bus, and in the exemplary embodiment, further includes data strobes (e.g. "DQS" signals) to facilitate the identification and capture of data at the receiving device (the buffer and/or the memory device(s). With ever-higher speed address, control, command and data bus operation, other methods in addition to or instead of strobes will be adopted to enable the identification and capture of information at the receiving device(s).

As shown in the exemplary memory device interface located between the memory data interface functional block 306 and the signals listed in 342, two copies of the memory interface information (such as address, control, command, data, error detection bits, etc) required to enable independent operation of a memory port are included on the hub device. In memory data interface functional block 306, 288 data signals are shown, with 72 data signals utilized for each read and/or write port. In addition, 72 DQS (strobe) differential signals are shown, with 18 intended for communication with the 144 data signals (e.g. data bits) comprising each of the two read/write data ports in this embodiment. Similarly, separate copies of such information as address, control and command data are included in the interface(s) connected to the memory command interface block 308. In this exemplary embodiment, two memory ports are supported by the hub device, implemented using additional circuitry (such as drivers and/or receivers) for each of the ports, thereby enabling simultaneous and/or independent operation of the two memory ports and the memory devices attached to these ports. In the exemplary embodiment the simultaneous and/or independent operation of the ports is determined by one or more of the initialization of the hub device and/or one or more of the control and/or command information and the address information received by the hub device. The four ports, as implemented in the exemplary hub circuitry shown in FIG. 3, enable modules and/or other memory subsystems using the hub device to selectively operate as one, two or four memory subsystems.

Data signals to be transmitted to the memory controller may be temporarily stored in the read/write data buffers 316 after a command, such as a read command, has been executed by the memory module, consistent with the memory device 'read' timings. The read/write data buffers 316 selectively transfer the read data into the upstream and/or downstream bus(es) via the MC protocol functional block 312 and upstream and/or downstream bus driver functional block(s) 330. The driver functional blocks 330 provide macros and support logic for the upstream (and/or downstream) memory bus(es). While most operations completed in the memory module are expected to be read and/or write operations initiated by the memory controller, in the exemplary embodiment the memory controller built in self-test (MCBIST) functional block 310 may also initiate read and/or write operations to the memory device(s) attached to the present hub device and/or one or more upstream and downstream hub device(s), using the one or more memory ports on the hub device(s). Data read from the memory device(s) may be locally processed within the hub device (e.g. by the MCBIST circuitry) as shown in the communication paths defined by the arrows in the hub device shown in FIG. 3.

As described earlier, the MCBIST functional block 310 provides built in self-test functions which act upon the local buffer, the local memory device(s) attached to the hub device. In response to the built-in self test (BIST) circuitry initiating the test functions, the resulting data, error and/or other information derived from the test is analyzed by the local hub. In an embodiment, the MCBIST functional block 310 provides DDR3/DDR4 users (e.g., memory device suppliers) a communication path to the memory device for bit repair and memory device traceability.

The Test and Pervasive functional block 302 communicates with one or more of FSI, I2C, JTAG or alternate bus types to which it is connected, providing an alternate means of communication to the memory controller and/or a service processor (the latter not shown in the figures but otherwise known in the art). The information sent and received by this block is used in exemplary embodiments for such operations as the initialization of the high speed bus(es), initialization of the hub device(s), initialization of the memory device(s) attached to the hub(s), error reporting, error recovery, diagnostic initialization, the reset of attached device(s), the programming of registers, drivers, and/or other circuitry related to the described operations, etc. In an embodiment, a user may have access to one or more memory devices through the hub device (e.g., through the Test and Pervasive block 302 to MCBIST block 310) to enable access and electronic repair of a failed memory bit, thus simplifying repair during manufacturing. Further, an embodiment of the Test and Pervasive block 302 and MCBIST block 310 enables memory device traceability for one or more memory device through hub device. For example, the traceability may allow tracking of a memory device that was manufactured with a bad lot of devices, thus enabling detection of the potentially failing device through the hub device.

The Test and Pervasive functional block 302 Input/Output signals ("IOs") are dual purpose IOs that are controlled by select input that changes the FSI[CD][01] signals into a boundary scan mode that are compliant to IEEE 1149.6 Boundary Scan/JTAG standards. These boundary scan signals work in conjunction with a Boundary Scan block 303 enable inputs TE_CARD_TEST_EN and TE_PLL_BYPASS EN. These enable inputs control internal clocks in the hub device block 602. The combination of boundary scan signals and enable inputs provide a integrated method for testing the interconnect of the memory module block 608 and hub device block 602 inclusively via the 276 pin connector defined in FIG. 4.

Table 1 shows the pins ("Full Service Interface" or "FSI pins") that serve as boundary scan input pins when the boundary scan functionality is enabled. The boundary scan function is enabled by setting a pin, such as a select pin ("FSI_SEL_B"), to "1", where the pins in the left column are used for the boundary scan test. When the pin is set to "0", the pins function as FSI pins, as shown below, for "normal" use of the pinout following the test. The FSI pins are for a serial communication protocol that allows serial communications ("SCOM") to inner parts of the chip being tested, such as the hub device.

TABLE 1

FSI to Boundary Scan Pin Table

| FSI_SEL_B; Select = '0' Non Boundary Scan Signal Name | FSI_SEL_B; Select = '1' Boundary Scan Signal Name | Boundary Scan Description |
|---|---|---|
| FSIC0 | TCK | Test Clock |
| FSIC1 | TMS | Test Mode State |
| FSID0 | TDI | Test Data In |
| FSID1 | TD0 | Test Data Out |
| TE_CARD_TEST_EN | Boundary Scan Enable | Enable to mux internal Clocks |
| TE_PLL_BYPASS_EN | Boundary Scan Enable | Enable to bypass PLL |

The block diagram in FIG. 3 is one implementation of a hub device that may be utilized by exemplary embodiments. Other implementations and/or functional assignment for these and other functional blocks are possible without departing from the scope of embodiments.

FIG. 4 is made up of FIGS. 4a, 4b and 4c, depicting a table illustrating a functional pin assignment and dimensional positioning of such pins on a 276-pin DIMM that may be implemented by an exemplary embodiment. In addition to the layout and approximate distance (shown in millimeters) from the positioning key to each pin. FIG. 4 also provides a high level functional description of each of the pins, including those used for special control functions. As indicated previously, designated pins 1-138 run from left to right on the front side (also referred to as the first side) of the DIMM when viewed from the front, with pins 139-276 located behind pins 1-138 when viewing the front side of the DIMM. Although not shown, other pin counts may be utilized in the exemplary embodiment, with pins added or removed, while maintaining the overall dimensional attributes and functions of the exemplary memory module.

The pins depicted in FIG. 4 include primary upstream bus interface pins labeled DMIUS and /DMIUS (e.g., DMIUS10 and /DMIUS10, located 7.5 millimeters and 8.5 millimeters respectively from the notch on the top of the module). In addition, the differential pin pairs are separated from each other by one or more pins assigned as power or ground pins, the thickness of the raw card or other signals which do not significantly detract from the high speed operation of the upstream bus(es). In addition, the pins depicted in FIG. 4 include primary downstream bus interface pins (labeled DMIDS0 and DMIDS0, located approximately 56.5 mm and 55.5 mm respectively from the notch on the top of the module) for communication with one or more differential downstream buses. In the exemplary embodiment, the downstream pins are located less than or equal to approximately 21.5 mm to the left of the positioning key (continuing to the right of the key), when viewed from the front of the module. In addition, the differential pin pairs are separated from each other by one or more pins assigned as power or ground pins, the thickness of the raw card or other signals which do not significantly detract from the high speed operation of the downstream bus(es). As depicted, FIG. 4 also includes pins (e.g., 31 and 169) that enable a boundary scan of the memory module. For example, the pins may enable a boundary scan to exercise an I/O chain inside a memory buffer chip of the module. Pins 31 TE_PLL_BYPASS and 169 TE_CARD_TEST_EN are enable pins to bypass the PLL function and access internal clocks in hub device 602 (FIG. 6), thus allowing a boundary scan controller to test the interconnect of the hub device and memory module block 608 inclusively. The boundary scan test is inclusive due to the memory buffer and the card being tested together via the interconnect and boundary scan pin functionality described in Table 1 and FIG. 4.

The pins depicted in FIG. 4 also include downstream clock interface pins (labeled DMIDSCK and /DMIDSCK) comprise a differential clock signal traveling with the high speed data to facilitate capture of that data on the bus(es) by the receiving device. In addition, upstream clock interface pins (labeled DMIUSCK and /DMIUSCK) comprise a differential clock signal traveling with the high speed data to facilitate capture of that data on the bus(es) by the receiving device. In the exemplary embodiment shown, the clock(s) are implemented as a "forwarded clock", traveling with the data being transferred by way of the high speed memory bus(es). Other clocking methods may be used in alternate embodiments to facilitate accurate capturing of the data by the receiving device(s).

Pins labeled GND are ground pins and pins labeled 3.3V, 2.5V, 1.5V, 1.35V or 1.25V (DDR3)/1.2V (DDR4), 1.0V and 0.9V are voltage pins. In alternate exemplary embodiments, one or more of the defined voltage pins will be set to different voltage levels, dependent on the receiving technology and/or communication methodology utilized, without departing from the teachings herein. The exemplary embodiment further includes a redundant set of "reset" pins (/RESET and /RESETr) located one behind the other on the front and back of the card, approximately 73.5 mm to the left of the notch when viewing the module from the front. These redundant pins provide a reliable means of externally receiving a synchronous and/or asynchronous "reset" signal—which is wired to the memory devices and well as to any of the other devices on the module (e.g. the buffer, registers, EEPROMs, etc) which may utilize the signal. In the exemplary embodiment, the reset function permits an external device (e.g. the memory controller, the processor, the service processor, a test device, etc) to return the receiving devices to a "known" state, facilitating power-up and initialization, permitting a rapid recovery from a fault and/or lock-up condition without the need to power-down and re-power the memory module and/or devices, etc. The use of redundant pins are intended to prevent the unintentional activation of the signal due to noise, coupling, vibration, corrosion (e.g. module and/or socket contacts) or other means, thereby dramatically increasing the fault-tolerance of the system relative to what would be a significant failure of the memory system if activated unintentionally.

Reference voltage pins are also included, for address, control, command and data pins (identified as VREFCA and VREFDQ, respectively) and are used for one or more of the receipt and distribution of reference voltages to devices on the module receiving such information and the innovative "in-situ" voltage margin testing and/or adjustment (e.g. optimization) of the receiving devices while the module is installed in a test, system or other environment.

Figure 5:
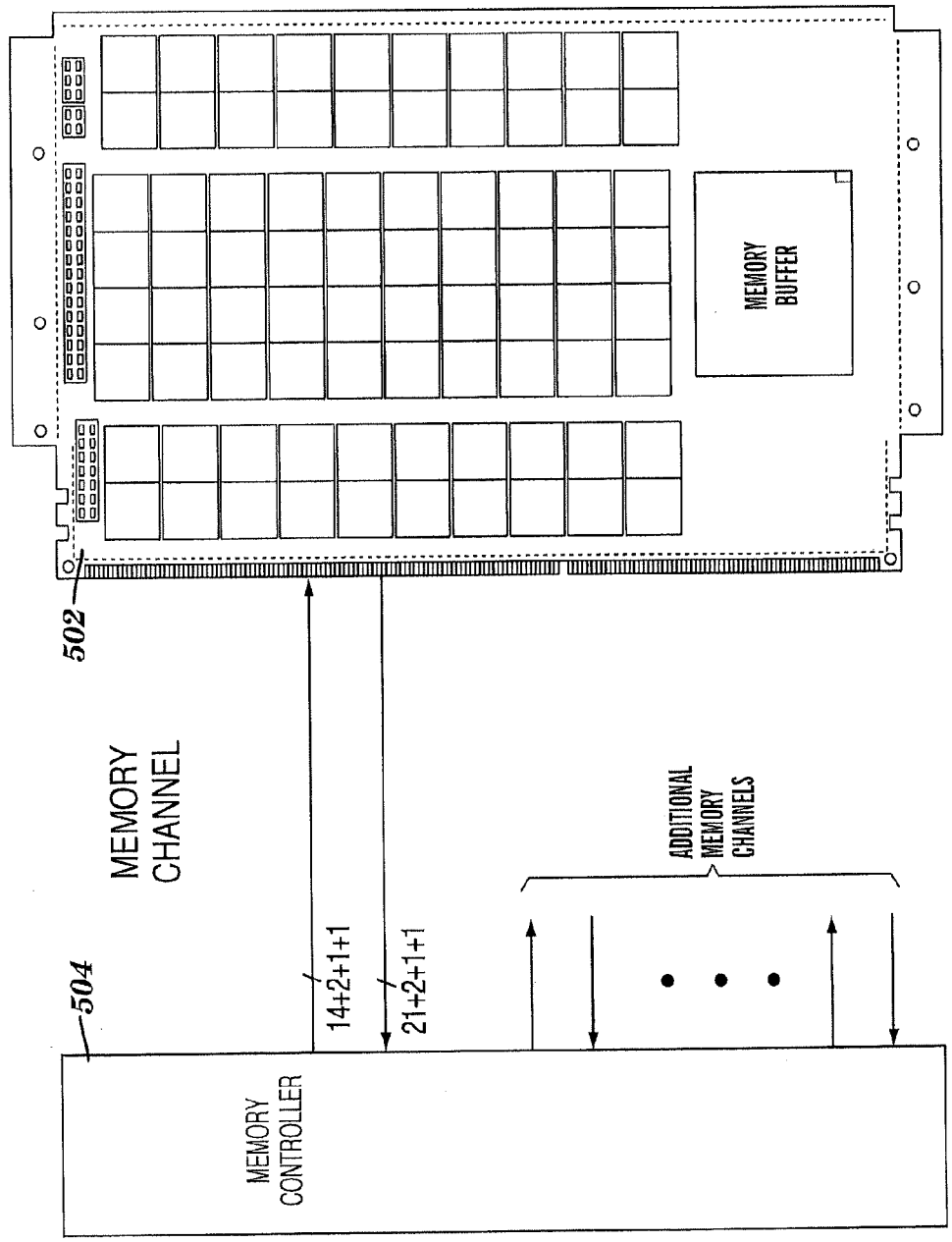
FIG. 5 depicts a memory system, comprising a single DIMM, that may be implemented by an exemplary embodiment.

FIG. 5 depicts a single point-to-point interconnect memory system that may be implemented by an exemplary embodiment. The configuration in FIG. 5 includes a single buffered memory module 502 directly connected to a memory controller 504 via a high-speed memory bus. Exemplary embodiments include one, two or more memory controller channels, enabling connection to the one memory module shown or to two or more memory modules 502.

Figure 6:
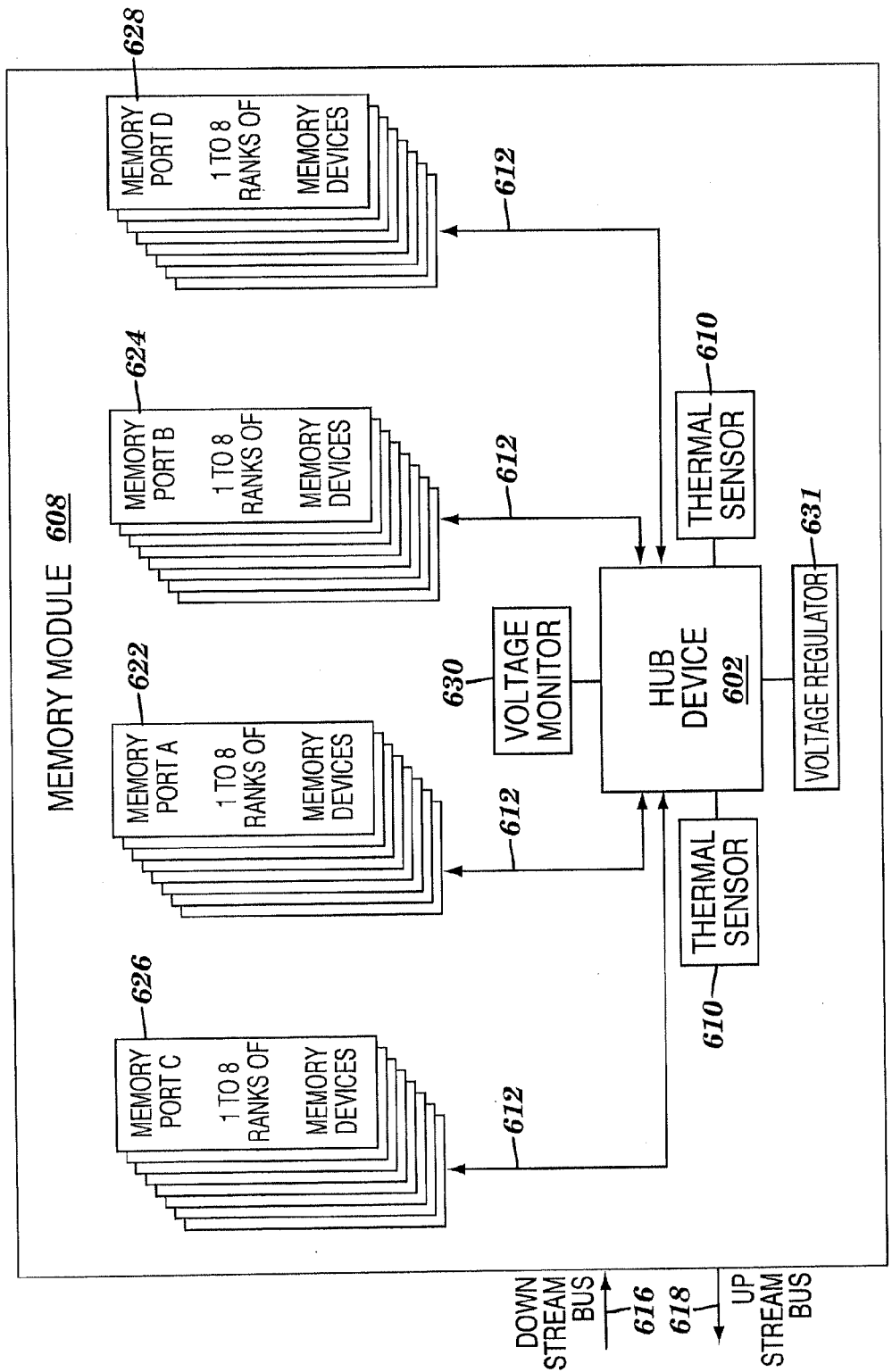
FIG. 6 depicts a dual-ported buffer on a memory module that may be implemented by an exemplary embodiment.

FIG. 6 depicts a memory module 608 with four full memory ports 612 (shown as memory port A, memory port B, memory port C and memory port D) that may be implemented by an exemplary embodiment. As depicted in FIG. 6, the memory module 608 includes a memory hub device 602 with four full memory ports 612 which enable communication (e.g. read, write, refresh, reset, memory device configuration, etc) of the one to eight ranks of memory devices connected to each of the four memory ports A, B, C and D. As previously described, the memory buffer (or hub) memory ports communicate with the attached memory devices at a device data rate, and comprise and/or permit communication of such signals as addresses, commands, controls, data, reset and other memory device signals and/or functions. The memory buffer sources such signals as addresses, commands and controls to connect to memory devices and terminate these signals to a voltage regulator device 631 with resistors. As further described, memory port A connects to a first group of one to eight ranks of memory devices 622 attached to one of the memory ports 612. Memory port B connects to a second group of one to eight ranks of memory devices 624 attached to a second one of the memory ports 612. Memory port C connects to a third group of one to eight ranks of memory devices 626 attached to one of the memory ports 612. Memory D connects to a fourth group of one to eight ranks of memory devices 628 attached to one of the memory ports 612. The exemplary embodiment of memory module 608 also includes two thermal sensors 610 and a voltage monitor 630, placed in different areas of the memory module (e.g. to the left or right of the memory buffer 602 on one side of the module, on the front and backside of the module and or in other separate regions of the module to better measure local module/device temperatures. Through the use of two or more independent thermal (e.g. temperature) sensors 610, shown as independent devices but which may also be incorporated in one or more of the EEPROM(s), buffer/hub device(s), memory device(s), etc, the device monitoring the temperature (such as the buffer, the memory controller, the processor, the service processor or other system element) can more accurately determine the local module temperature of each memory rank (which will often be operated independently) and/or more accurately reflect module temperature(s) when cooling air is blown across an exemplary module from the left to the right or from the right to the left in different applications. Thermal sensors may also be used as an early indicator of a potential card failure, such as resulting from a memory device and/or buffer device overheating due to excessive current drains (e.g. due to a semiconductor resistive fault such as due to a dielectric faults/breakdown), support device failures (such as capacitor low resistance shorts due to dielectric faults/breakdowns) and a raw card failure (such as due to low resistance shorts between raw card layers. In an exemplary embodiment, each memory port 612 can support one to eight ranks of memory devices with each rank having eight bytes of data and eight bits of ECC (e.g. supporting a 64/72 bit data/ECC structure) plus 8 bits from a spare DRAM (in total 80 bit data word). Exemplary embodiments will often include additional connections to memory module 608 for such purposes as the communication of module characteristics, module faults, the completion of initialization, module and/or device reset, etc.

Table 2 depicts a table of functional voltage pins for DDR3 or DDR4 memory devices that may be implemented in an exemplary embodiment of the memory system. A memory device of type DDR3 requires either 1.35 or 1.25 volts where by memory devices of type DDR4 require both 1.2 and 2.5 volts. Accordingly, pins listed in FIG. 4 as 2.5V pins are used for only DDR4 memory devices. In addition, pins listed in FIG. 4 as 1.35V are for type DDR3 memory devices and these pins can support 1.25V and 1.2V for low power DDR3 memory devices and DDR4 memory devices, respectively.

TABLE 2

DDR3 and DDR4 Voltage Pin Table

| Front Side Pins | Back side Pins | DDR3 Voltage | DDR4 Voltage |
|---|---|---|---|
| 4 | 142 | No Connect | 2.5 v |
| 7 | 145 | 1.35 v | 1.2 v |
| 10 | 148 | No Connect | 2.5 v |
| 11 | 149 | 1.35 v | 1.2 v |
| 12 | 150 | 1.35 v | 1.2 v |
| 14 | 152 | 1.35 v | 1.2 v |
| 15 | 153 | 1.35 v | 1.2 v |
| 18 | 156 | No Connect | 2.5 V |
| 19 | 157 | 1.35 v | 1.2 v |
| 23 | 161 | 1.35 v | 1.2 v |
| 24 | 162 | 1.35 v | 1.2 v |
| 29 | 167 | 1.35 v | 1.2 v |
| 31 | 169 | 1.35 v | 1.2 v |
| 32 | 170 | No Connect | 2.5 v |
| 43 | 181 | 1.35 v | 1.2 v |
| 44 | 182 | 1.35 v | 1.2 v |
| 55 | 193 | 1.35 v | 1.2 v |
| 56 | 194 | 1.35 v | 1.2 v |
| N/A | 205 | 1.35 v | 1.2 v |
| N/A | 206 | 1.35 v | 1.2 v |
| 88 | 226 | 1.35 v | 1.2 v |
| 89 | 227 | 1.35 v | 1.2 v |
| 118 | 256 | 1.35 v | 1.2 v |
| 131 | 269 | 1.35 v | 1.2 v |

Figure 7:
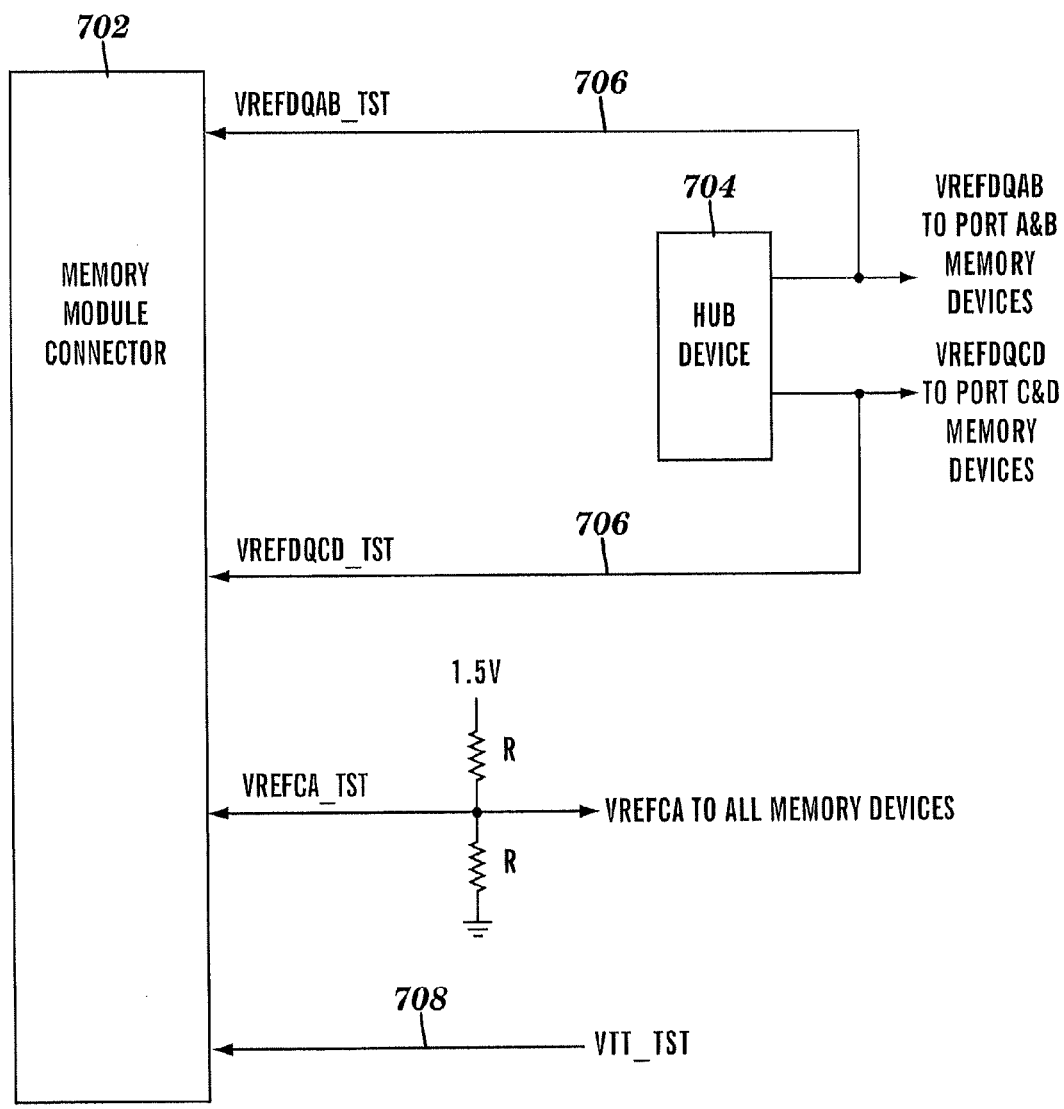
FIG. 7 depicts a memory module with an interface test capability that may be implemented by an exemplary embodiment.

FIG. 7 depicts a memory module with a memory device interface test capability that may be implemented by an exemplary memory module and memory system embodiment. In this exemplary embodiment, the hub device 704 outputs a programmable VREFDQ (data I/O reference voltage) 706 for each port of the hub device 704. During normal operation, the VREF reference voltage is nominally set by the hub device 704 to half of the data I/O voltage (e.g. VDD) supply (e.g. ½ of 1.35V, or 0.675V), with valid 1's and 0's detected by the hub device 704 and memory device(s) by comparing the received data bits relative to the reference voltage, consistent with the valid "1" and "0" levels specified in the memory device specifications as voltage values relative to VREF. During initialization, diagnostic or related operations, the reference voltage is adjusted by the hub device 704 to be more or less than half of the data I/O voltage supply, thereby permitting the hub device 704 (e.g. using BIST circuitry), the memory controller, a service processor or some other controlling device and/or circuitry to determine the reference voltage at which 1's and 0's are accurately detected. Once the optimal voltage reference for the data I/O interface is determined (e.g. by finding the voltage reference value at which 1's and 0's are accurately received relative to the voltage reference value(s) during a read operation and determining the midpoint between the two data I/O reference voltage values), the hub device 704 can set the local voltage reference to that value for the period of time until the data I/O reference voltage is re-characterized. In addition to maximizing the voltage margin for data transferred between the hub device 704 and the memory devices, this innovative solution further permits voltage margin testing of the hub device 704 and/or memory devices to be completed in-situ (e.g. in the actual environment), further allowing for marginal memory devices and/or memory modules to be detected as a means of improving overall system reliability and serviceability. An external device (such as a memory controller, processor, service processor, etc) may monitor the data I/O reference voltage by attaching to the VREFDQA_TST, VREFDQB_TST, VREFDQC_TST and VREFDQD_TST pins located on the module (e.g., a memory module connector 702). Although the data I/O reference voltage is locally determined and/or generated on the module by the hub device 704 in exemplary embodiments, further embodiments may have the I/O voltage generated by other means (e.g. by a voltage regulation device, the memory controller or some other means), with the VREFDQA_TST, VREFDQB_TST, VREFDQC_TST and VREFDQD_TST pins then used in a manner such as to characterize and set the reference voltage at the hub device 704 and memory devices. The exemplary embodiment offers a dramatic increase in flexibility and reliability over previous module solutions, relative to data communication/capture integrity.

FIG. 7 also includes an exemplary VREFCA_TST pin which connects to a voltage divider which nominally sets a VREFCA voltage of half of VDD, with this reference voltage further connected to each of the memory devices. With the exemplary VREFCA pin, a device external to the memory module can override, as well as measure, the reference voltage set by the voltage divider, resulting in the same benefits as described previously for the VREFDQ test pins, except now related to the command, control and address pins of the memory devices. Although not shown in FIG. 7, alternate exemplary embodiments could include the VREFCA_TST voltage setting determined and/or adjusted by the memory hub device 704, such as under the control of the BIST circuitry during on-module margin testing of the address, control and command inputs. A VREFCA_TST voltage pin on the memory hub device 704 would be connected to the VREFCA_TST wire shown, to enable the hub device 704 to generate, monitor, increase and/or decrease the VREFCA voltage to the DRAMs.

In an embodiment, FIG. 7 also includes a VTT_TST pin 708 which connects to a VTT voltage plane for terminating the memory device address, command and control signals which are sourced from the HUB chip and terminated through a number of series resistors and voltage regulator device. The VTT voltage plane 708 is connected to a voltage regulator set to half of the VDD voltage (0.675 volts) that provides the lower power source for sourcing and sinking the address, command and control signals received from said HUB device. The VTT_TST pins in memory module connector 702 provides in system monitoring of the termination voltage ½ VDD.

Figure 8:
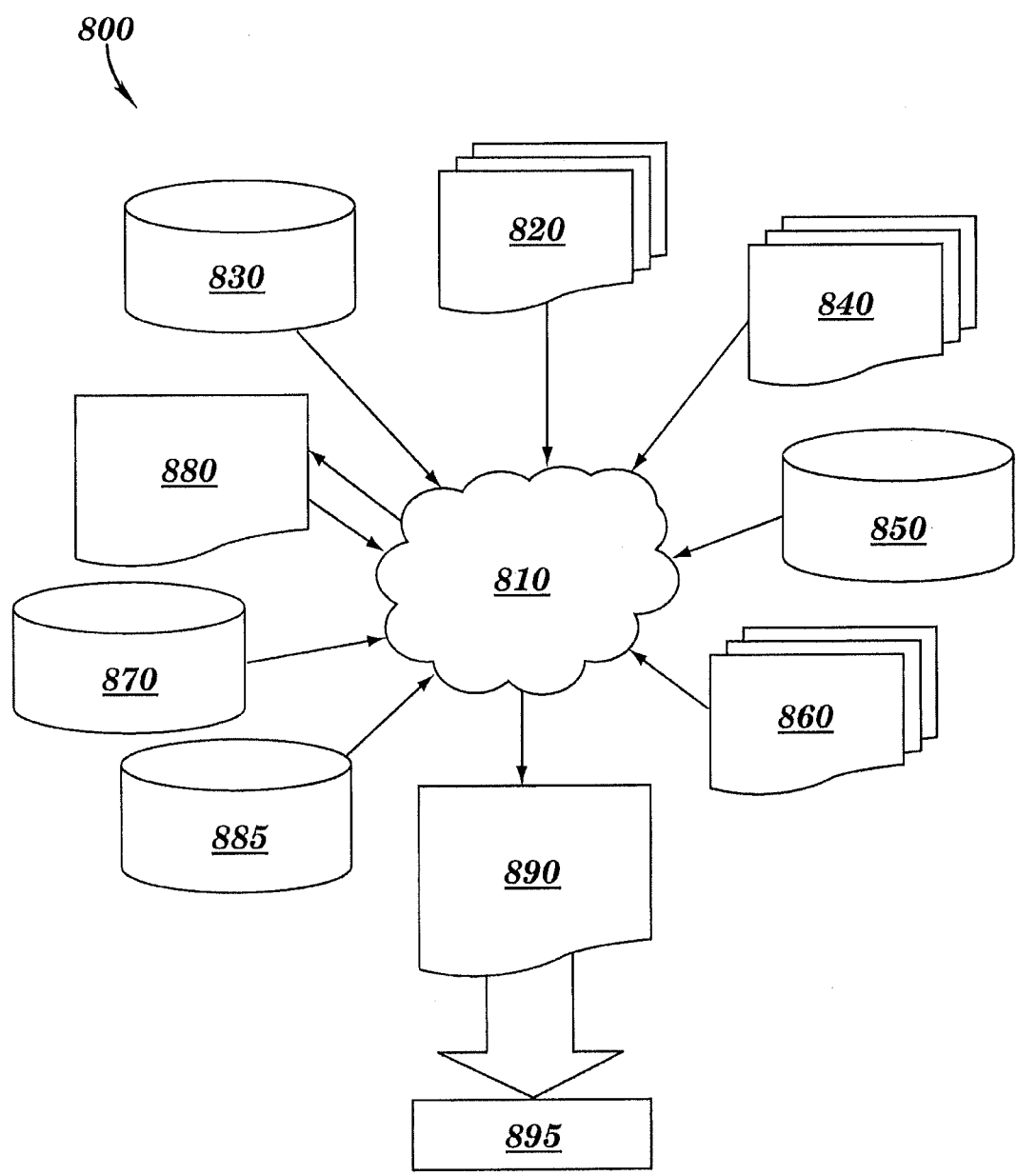
FIG. 8 is a flow diagram of a design process used in semiconductor design, manufacture and/or test.

FIG. 8 shows a block diagram of an exemplary design flow 800 used for example, in semiconductor IC logic design, simulation, test, layout, and manufacture. Design flow 800 includes processes and mechanisms for processing design structures or devices to generate logically or otherwise functionally equivalent representations of the design structures and/or devices described above and shown in FIG. 3. The design structures processed and/or generated by design flow 800 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIG. 3. As such, design structure 820 may comprise files or other data structures including human and/or machine-readable source code, compiled structures, and computer-executable code structures that when processed by a design or simulation data processing systems, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIG. 3 to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of embodiments. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments shown in FIG. 3. In one embodiment, design structure 890 may comprise a compiled, executable HDL simulation model that functionally simulates the devices shown in FIG. 3.

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 3. Design structure 890 may then proceed to a stage 895 where, for example, design structure 890: proceeds to tape-out, is released to manufacturing, is released to a mask house, is sent to another design house, is sent back to the customer, etc.

Figure 9:
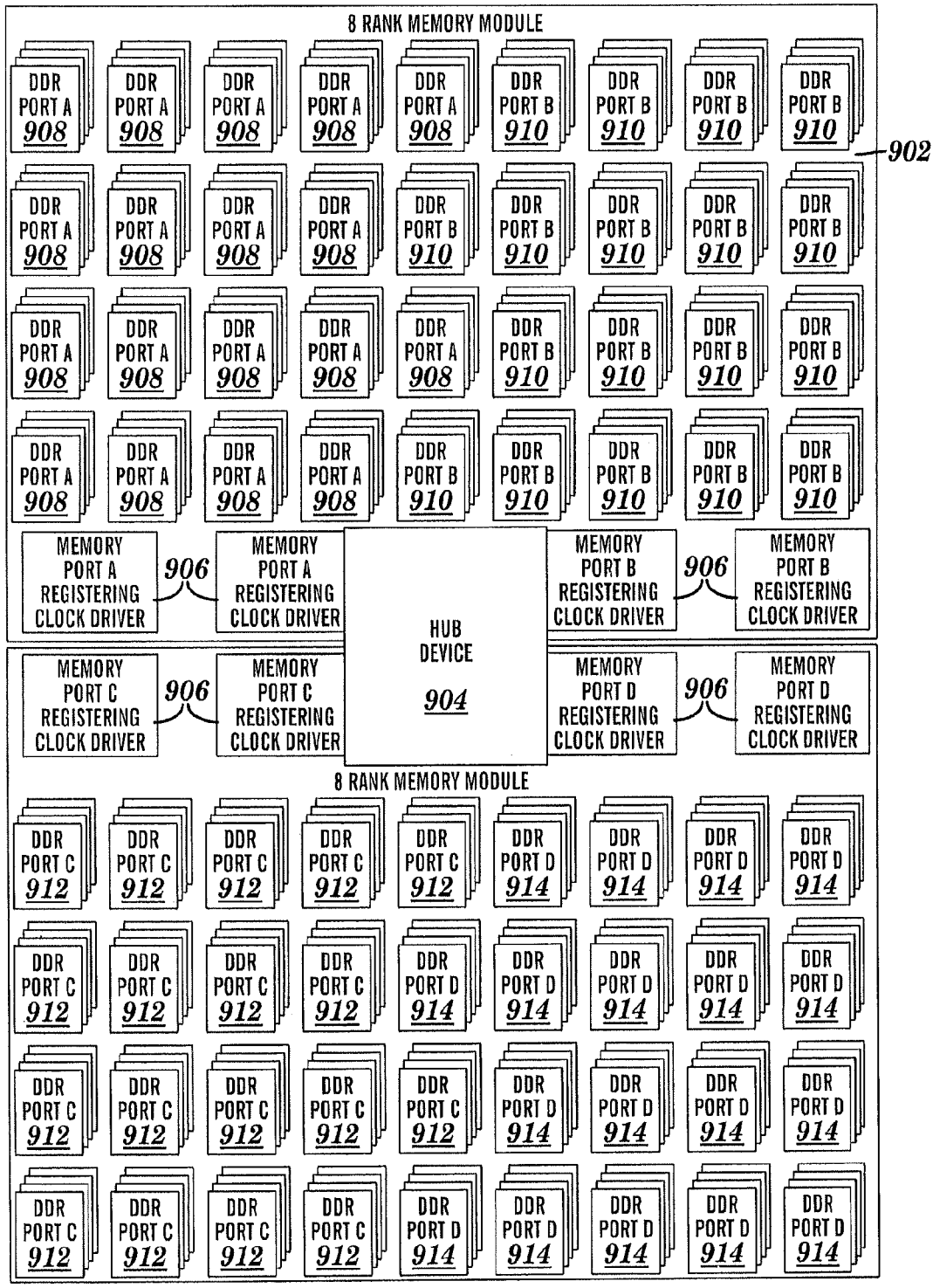
FIG. 9 depicts a memory module with eight ranks of memory that may be implemented by an exemplary embodiment.

FIG. 9 depicts a memory module with eight ranks of memory that may be implemented by an exemplary embodiment. The eight rank configuration depicted in FIG. 9 includes memory module 902 with a memory buffer device 904 having four full memory ports "A", "B", "C" and "D" and including eight registering clock driver devices 906 (implemented in the exemplary embodiment as two registering clock driver devices for each port on the memory buffer). The discrete registering clock driver devices 906 are included between the hub device 904 (ports A, B, C and D) and the memory devices to re-drive the memory device buses, including one or more of the device address, control, command, data, reset and/or other device pins sourced from the memory buffer. The memory devices 908 connect to port "A" of the memory buffer, wherein the memory devices 910 connect to port "B" of the memory buffer, wherein the memory devices 912 connect to port "C" of the memory buffer and wherein the memory devices 914 connect to port "D" of the memory buffer. Although four memory devices are shown in each memory device position of the exemplary embodiment (the eight devices produced as memory device stacks within one package, memory device packages stacked together and/or a combination of the two), memory modules could be produced having more or less than four memory devices in each memory device position. For example, in an embodiment eight memory devices may be located in each memory position. Although two registering clock drivers are shown for each memory port, a single higher density and/or higher performance registering clock driver (or a larger number of registering clock drivers) could be connected between the memory buffer port and the memory devices attached to that port, depending on the performance and reliability targets as well as the signal/clock counts for a given module configuration.

The use of registering clock drivers (or related re-drive and/or re-synchronization circuitry, often having 2 sets of outputs for at least a portion of the signal inputs) external to the memory buffer present an innovative solution for increasing memory module density and/or performance, with minimal if any increase in pins on the memory buffer device, which is often pin or power-limited. For example, reference clock interface pins (e.g., DMI_REFCLK) may be used for synchronizing high speed differential upstream and downstream channels. In another example, reference clock interface pins (e.g., DDR_REFCLK) may be used for synchronizing a memory interface. In further exemplary embodiments, point-to-point interconnections can be used between the memory buffer and registering clock driver for critical nets, the registering clock driver can increase module performance by distributing the load presented by the memory devices across multiple driver circuits, driver circuits can be separately configured to optimize signal performance and quality for memory devices located near to or far from the memory buffer, the memory buffer can communicate with the registering clock driver(s) using a narrower, higher speed bus and/or a different voltage interface than that required for communication with the memory devices to reduce memory buffer pincount and/or allow the memory buffer to be memory device technology independent. Although described as a "registering clock driver", the re-drive device(s) may be comprised solely of re-drive circuitry and/or include clock re-syncing circuitry such as PLL and DLL function(s).

Although not shown in FIG. 9, the "quad stacked"/"quad die" DDR3/DDR4 memory devices used on the exemplary memory module shown are interconnected in an innovative manner to minimize the signals needed on the "quad" DRAMs and the memory buffer, as well as the pin counts of these devices, while meeting performance and power consumption targets. In the exemplary embodiment of a Quad "x4" package, the clock enable pins (CKE0 and CKE1) on the four memory devices are interconnected such that the first and third devices in the stack connect to CKE0 and the second and fourth devices to CK1. The ODT (on die termination) signals of the two memory devices connected to CKE1 are tied to VDD (internal or external to the memory devices/package), whereas the ODT signal on one of the remaining devices (connected to CKE0) is wired to ODT0 and the ODT signal on the last of the four memory devices (also connected to CKE0) is wired to ODT1. The ODT signals are sourced by the memory buffer, and in the embodiment shown in FIG. 9, are first re-driven by the registering clock driver circuits. In the exemplary embodiment, all other utilized signal, power and ground pins (or pads) on the four memory devices are interconnected to corresponding signal, power and ground pins.

In embodiments, the memory device is not limited to quad stacked DDR3/DDR4 memory devices. The number of stacking memory devices can increased by using 3DS device technology leveraging through silicon via technology. For example, such methods allow the equivalent memory density or better to be achieved without requiring re-driven signals by a registering clock driver circuits. In an exemplary embodiment, all other utilized signal, power and ground pins (or pads) on the eight memory devices are interconnected to corresponding signal, power and ground pins.

The exemplary module set also includes a four port and four rank memory module constructed with x4 devices packaged in a two-high device stack (although planar (1-high) memory devices and other packaging methods may also be used in this and/or alternate compatible versions). The exemplary embodiment further includes a memory buffer device and two DDR3 (or DDR4) registering clock driver devices, which re-drive and/or re-sync the signals from the buffer device to the memory devices, similar to that shown in FIG. 9. Other exemplary embodiments may be manufactured using x1, x2, x4, x8, x16 and/or other memory device data widths, with or without external re-drive circuitry depending on the memory device availability, module density requirement, performance requirement, reliability requirement, power requirement and/or other application needs. The nominal operating performance range of the exemplary buffered memory module embodiments for data I/Os range from 800 MT (million transfers) per second per pin to 1600 MT/s between the memory devices and the memory buffer, with specific designs operating at transfer rates consistent with system requirements. In the exemplary embodiment, the corresponding transfer rate for the high speed interface is four times that of the memory device data interface, or 3200 MT/s to 6400 MT/s. Other slower transfer rates are supported for very high density modules (e.g. 600 MT/s at the device and 2400 MT/s for the module respectively), with other (even slower) transfer rates supported (e.g. 200 MT/s at the buffer to memory device interface) by at least the memory module(s) and buffer device(s) for one or more of debug and bring-up purposes.

In an exemplary embodiment, hub devices may be connected to the memory controller through a multi-drop or point-to-point bus structure. Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(es) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. DIMMs have been constructed with pincounts ranging from 100 pins to over 300 pins. In exemplary embodiments described herein, memory modules may include two or more hub devices.

In alternate exemplary embodiments, the point-to-point bus includes a switch or bypass mechanism which results in the bus information being directed to a hub device during downstream communication as well as directing upstream information (communication from a hub device on a memory module to the memory controller), often by way of one or more upstream hub device. The continuity module(s) might further include a non-volatile storage device (such as an EEPROM), but would not include main memory storage devices.

In exemplary embodiments, the memory system includes a hub device on one or more memory modules connected to the memory controller via a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop buses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or buses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points that form a main transmission path that electrically connects two or more transceivers, transmitters and/or receivers. The term "bus" is contrasted with the term "channel" which is often used to describe the function of a "port" as related to a memory controller in a memory system, and which may include one or more buses or sets of buses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including soldered interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency(ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface buses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated with the various components and/or characteristics associated with that subsystem, and ultimately by programming the appropriate devices with information associated with the intended operation within that system.

A second initialization method would include one in which the high speed bus is operated at one frequency during the initialization process, then at a second (and generally higher) frequency during the normal operation.

A fourth initialization method might utilize a distinct bus, such as a presence detect bus, an I2C bus (such as defined in published JEDEC standards such as the 168 Pin DIMM family in publication 21-C revision 7R8) and/or the SMBUS, which has been widely utilized and documented in computer systems using such memory modules.

Other methods for initialization can also be used, in conjunction with or independent of those listed. The use of a separate bus, such as described in the fourth embodiment above, also offers the advantage of providing an independent means for both initialization and uses other than initialization, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on buses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include an improvement in memory subsystem reliability and fault tolerance while providing a flexible set of memory configurations.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A memory card comprising:
    a rectangular printed circuit card having a first side and a second side, a first length of between 151.35 and 161.5 millimeters, and first and second ends having a second length smaller than the first length;
    a first plurality of pins on the first side extending along a first edge of the rectangular printed circuit card that extends along a length of the rectangular printed circuit card;
    a second plurality of pins on the second side extending on the first edge of the rectangular printed circuit card; and
    a positioning key having its center positioned on the first edge of the rectangular printed circuit card and located between 94.0 and 95.5 millimeters from the first end of the rectangular printed circuit card,
    the first plurality of pins and the second plurality of pins including pins for boundary scan testing of components located on the memory card, the pins for boundary scan testing including at least one pin configured for receiving boundary scan signals from a memory controller or a service processor via a bus, and at least two other pins dedicated to enabling boundary scan testing that control internal clocks of the components and that work in conjunction with the boundary scan signals to test an interconnect of the components.

2. The memory card of claim 1, further comprising:
    a hub device attached to the rectangular printed circuit card for converting a packetized memory interface received via one or more high speed buses, wherein one or both of the first and second plurality of pins includes a plurality of high-speed bus interface pins arranged on the rectangular printed circuit card for communicating with the one or more high-speed buses.

3. The memory card of claim 2, wherein the hub device is configured to enable bit repair of a memory device through the hub device.

4. The memory card of claim 2, wherein the hub device is configured to enable traceability for a memory device on the rectangular printed circuit card.

5. The memory card of claim 2, further comprising:
    first, second, third and fourth ranks of memory devices attached to the rectangular printed circuit card;
    a first port in communication with the first ranks of memory devices;
    a second port in communication with the second ranks of memory devices,;
    a third port in communication with the third ranks of memory devices; and
    a fourth port in communication with the fourth ranks of memory devices, wherein the first, second, third and fourth ports are operable simultaneously and independently of each other to access the first, second, third and fourth ranks of memory devices.

6. The memory card of claim 1, further comprising a thermal sensor for ranks of memory devices attached to the rectangular printed circuit card at one side of the hub device and a second thermal sensor for other ranks of memory devices attached to the rectangular printed circuit card at the other side of the hub device.

7. The memory card of claim 1, further comprising a voltage monitor configured to monitor voltage of a memory device attached to the rectangular printed circuit card at one side of the hub device.

8. The memory card of claim 1, further comprising one or more ranks of memory devices attached to the rectangular printed circuit card, wherein the hub device includes logic to communicate with the memory devices via a memory module interface.

9. The memory card of claim 1, wherein the pins for boundary scan testing of components located on the rectangular printed circuit card further comprise pins for boundary scan signals for testing an interconnect of a memory module and a hub device through the first plurality of pins and the second plurality of pins and wherein the first plurality of pins and the second plurality of pins in total include at least 276 pins.

10. The memory card of claim 1, wherein the first plurality of pins and the second plurality of pins include a reference voltage pin for monitoring a reference voltage level sent to a memory device during system test.

11. The memory card of claim 1, wherein the first plurality of pins further comprises reference clock interface pins for synchronizing high speed differential upstream and downstream channels, such that the reference clock interface pins are located between 18.5 and 21.5 millimeters to the left of the positioning key when viewed from the first side.

12. The memory card of claim 1, wherein the first plurality of pins further comprises reference clock interface pins for synchronizing a memory interface, such that the reference clock interface pins are located between 15.5 and 18.5 millimeters to a left of the positioning key when viewed from the first side.

13. A memory card comprising:
    a card having a length of between 151.5 and 161.35 millimeters, the card having a first side including a first end, a second end, and a first edge that extends the length of the card between the first end and the second end;
a positioning key having its center positioned on the first edge and located 89.5millimeters from a first pin proximate the first end of the card and positioned 51.5 millimeters from a last pin proximate the second end of the card when viewed from the first side;
a plurality of primary upstream bus interface pins arranged on the card for communicating with a high-speed upstream bus, such that the primary upstream bus interface pins associated with the high-speed upstream bus are located between 14.5 millimeters to a left and 29.5 millimeters to a right of the positioning key and the first end when viewed from the first side; and
a plurality of pins for boundary scan testing an interconnect of a memory module and a hub device on the memory card, the plurality of pins being located between 86.5 millimeters and 58.5 millimeters to the left of the positioning key when viewed from the first side, the plurality of pins for boundary scan testing including at least one pin that receives boundary scan signals from a memory controller or a service processor via a bus, and at least two other pins dedicated to enabling boundary scan testing, the at least two other pins dedicated to enabling boundary scan testing configured to control internal clocks of the hub device and to work in conjunction with the boundary scan signals to provide an integrated method for testing the interconnect of the memory module and the hub device.

14. The memory card of claim 13, further comprising a plurality of primary downstream bus interface pins arranged on the card for communicating with a high-speed downstream bus, such that the primary downstream bus interface pins associated with the high-speed downstream bus are located less than 56.5 millimeters to the left of the positioning key and the second end when viewed from the first side.

15. The memory card of claim 13, further comprising downstream clock interface pins for communicating with a differential downstream clock, such that the downstream clock interface pins are located between 39.5 and 42.5 millimeters to the left of positioning key when viewed from the first side.

16. The memory card of claim 13, further comprising upstream clock interface pins for communicating with a differential upstream clock, such that the upstream clock interface pins are located between 9.5 and 12.5 millimeters to the right of the positioning key when viewed from the first side.

17. A memory card comprising:
a card having a length of between 151.5 and 161.35 millimeters, the card having a first side and a second side, the first side including a first end, a second end, and a first edge that extends the length of the card between the first end and the second end;
a positioning key having its center positioned on the first edge and located between 94.0 and 95.5 millimeters from the first end of the card when viewed from the first side;
a plurality of paired adjacent differential high-speed signal interface pins for communicating with differential high-speed signals located on the first edge, such that each pair of adjacent differential high-speed signal pair is separated by at least one additional pin or by a distance between the first and the second side, wherein the at least one additional pin is one or both of a voltage pin and a ground pin;
a memory module located on the memory card;
a hub device located on the memory card; and
a plurality of pins for boundary scan signals for testing an interconnect of the memory module and the hub device on the memory card, the plurality of pins for boundary scan testing including at least one pin configured for receiving boundary scan signals from a memory controller or a service processor via a bus, and at least two other pins dedicated to enabling boundary scan testing, the at least other two pins dedicated to enabling boundary scan testing configured to control internal clocks of the hub device and to work in conjunction with the boundary scan signals to provide an integrated method for testing the interconnect of the memory module and the hub device.

18. The memory card of claim 17, comprising a plurality of memory device voltage supply pins configured to support both DDR3 and DDR4 memory devices.

19. The memory card of claim 17, further comprising two downstream clock interface pins for communicating with a differential downstream clock, such that the downstream clock interface pins are located between 39.5 and 42.5 millimeters to a left of positioning key when viewed from the first side.

20. The memory card of claim 17, further comprising two upstream clock interface pins for communicating with a differential upstream clock, such that the upstream clock interface pins are located between 9.5 and 12.5 millimeters to a right of the positioning key when viewed from the first side.

* * * * *